(12) United States Patent
Tong et al.

(10) Patent No.: US 9,123,724 B2
(45) Date of Patent: Sep. 1, 2015

(54) METHODS OF FORMING SECURED METAL GATE ANTIFUSE STRUCTURES

(71) Applicant: Intel Corporation, Santa Clara, CA (US)

(72) Inventors: Xianghong Tong, Hillsboro, OR (US); Zhanping Chen, Hillsboro, OR (US); Walid M. Hafez, Portland, OR (US); Zhiyong Ma, Hillsboro, OR (US); Sarvesh H. Kulkarni, Hillsboro, OR (US); Kevin X. Zhang, Portland, OR (US); Matthew B. Pedersen, Beaverton, OR (US); Kevin D. Johnson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/134,097

(22) Filed: Dec. 19, 2013

(65) Prior Publication Data

US 2014/0103448 A1 Apr. 17, 2014

Related U.S. Application Data

(62) Division of application No. 13/077,681, filed on Mar. 31, 2011, now Pat. No. 8,618,613.

(51) Int. Cl.
*H01L 27/11* (2006.01)
*H01L 29/04* (2006.01)
*H01L 21/02* (2006.01)
(Continued)

(52) U.S. Cl.
CPC ............ *H01L 23/5252* (2013.01); *H01L 21/44* (2013.01); *H01L 27/0207* (2013.01); *H01L 27/0629* (2013.01); *H01L 27/11206* (2013.01); *H01L 29/861* (2013.01); *H01L 2924/0002* (2013.01)

(58) Field of Classification Search
CPC ............ H01L 23/5252; H01L 27/0629; H01L 27/0207; H01L 27/11206; H01L 29/861; H01L 2924/0002
USPC ............... 257/379, 50, 344, 798, 530; 365/96
See application file for complete search history.

(56) References Cited

U.S. PATENT DOCUMENTS 4,943,538 A 7/1990 Mohsen et al.
5,831,923 A 11/1998 Casper (Continued)

FOREIGN PATENT DOCUMENTS

WO 2012/134585 A1 10/2012

OTHER PUBLICATIONS

International Search Report and Written Opinion received for PCT Patent Application No. PCT/US2011/067869, mailed on Aug. 24, 2012, 9 pages.

(Continued)

*Primary Examiner* — Long K Tran
*Assistant Examiner* — Dzung Tran
(74) *Attorney, Agent, or Firm* — Forefront IP Lawgroup, PLLC

(57) ABSTRACT

Methods of forming and using a microelectronic structure are described. Embodiments include forming a diode between a metal fuse gate and a PMOS device, wherein the diode is disposed between a contact of the metal fuse gate and a contact of the PMOS device, and wherein the diode couples the contact of the metal fuse gate to the contact of the PMOS device.

9 Claims, 5 Drawing Sheets

(51) Int. Cl.
  *H01L 23/58*    (2006.01)
  *H01L 23/525*   (2006.01)
  *H01L 27/02*    (2006.01)
  *H01L 27/112*   (2006.01)
  *H01L 27/06*    (2006.01)
  *H01L 21/44*    (2006.01)
  *H01L 29/861*   (2006.01)

(56) References Cited

U.S. PATENT DOCUMENTS

| | | | |
|---|---|---|---|
| 6,421,293 | B1 | 7/2002 | Candelier et al. |
| 6,477,094 | B2 | 11/2002 | Kim et al. |
| 6,624,031 | B2 | 9/2003 | Abadeer et al. |
| 6,897,543 | B1 | 5/2005 | Huang et al. |
| 6,940,751 | B2 | 9/2005 | Peng et al. |
| 7,157,782 | B1 | 1/2007 | Shih et al. |
| 2004/0156234 | A1* | 8/2004 | Peng et al. .................. 365/177 |
| 2005/0024973 | A1* | 2/2005 | Porter et al. .............. 365/225.7 |
| 2006/0028878 | A1* | 2/2006 | Parks ...................... 365/189.01 |
| 2006/0092742 | A1* | 5/2006 | Paillet et al. ............. 365/225.7 |
| 2006/0289864 | A1 | 12/2006 | Fifield et al. |
| 2006/0291316 | A1* | 12/2006 | Jenne ....................... 365/225.7 |
| 2007/0183181 | A1* | 8/2007 | Peng et al. ..................... 365/96 |
| 2010/0165699 | A1* | 7/2010 | Chen et al. .................... 365/96 |

OTHER PUBLICATIONS

International Preliminary Report on Patentability received for PCT Patent Application No. PCT/US2011/067869, mailed on Oct. 10, 2013, 6 Pages.

Office Action received for U.S. Appl. No. 13/077,681, mailed on Oct. 23, 2012, 16 Pages.

Office Action received for U.S. Appl. No. 13/077,681, mailed on Apr. 9, 2013, 11 Pages.

Notice of Allowance received for U.S. Appl. No. 13/077,681, mailed on Aug. 23, 2013, 9 Pages.

* cited by examiner

METHODS OF FORMING SECURED METAL GATE ANTIFUSE STRUCTURES

RELATED APPLICATIONS

The present application is a Divisional of U.S. application Ser. No. 13/077,681 filed Mar. 31, 2011, entitled "METHODS OF FORMING SECURED METAL GATE ANTIFUSE STRUCTURES".

BACKGROUND

The use of fuses in microelectronic circuits is widespread. Fuses may provide a convenient way of encoding information permanently in a device, such as for purposes of redundancy, unit identification, providing allowed operating ranges, for example. Fuses can also be used to adjust the speed of a circuit by adjusting the resistance of the current path, for example. An integrated circuit device, for example a microprocessor, may contain sensitive information stored in programmed fuses. A concern with conventional fuse arrays, however, is that voltage contrasts between blown and un-blown fuses could be detectable by hackers or counterfeiters with malevolent motives.

BRIEF DESCRIPTION OF THE DRAWINGS

While the specification concludes with claims particularly pointing out and distinctly claiming certain embodiments, the advantages of the embodiments can be more readily ascertained from the following description when read in conjunction with the accompanying drawings in which:

DETAILED DESCRIPTION

Figure 6:
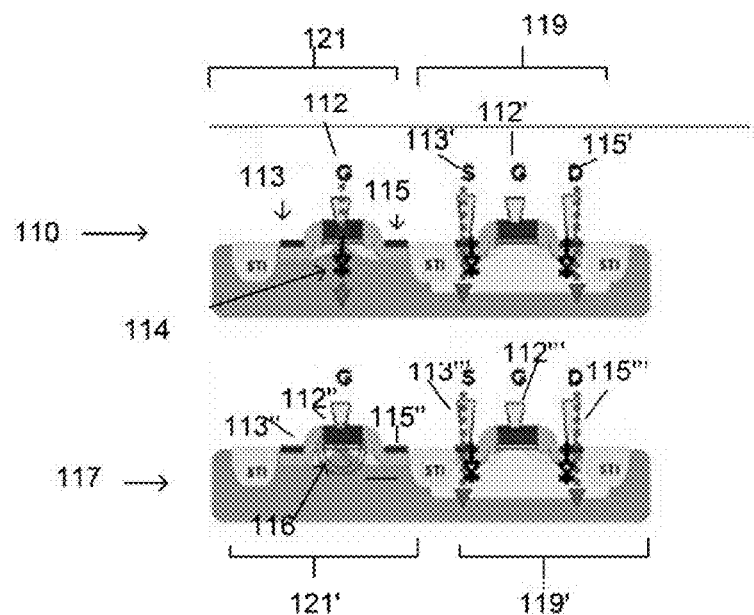
FIG. 6 represents a structure according to the Prior Art.

In the following detailed description, reference is made to the accompanying drawings that show, by way of illustration, specific embodiments in which the embodiments may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the invention. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a metal gate anti-fuse structure, are described. Embodiments include forming a diode between a metal fuse gate and a PMOS device, wherein the diode is disposed between a contact of the metal fuse gate and a contact of the PMOS device, and wherein the diode couples the contact of the metal fuse gate to the contact of the PMOS device. Embodiments of the invention herein enable enhanced security of electronic data within fuse array circuits which may be sensitive.

FIG. 6 depicts a portion of a Prior Art anti fuse circuit structure 110. In the anti fuse circuit structure 110, a programming PMOS device 119 comprises source/drain structures 113', 115' and a gate structure 112', wherein the gate structure 112' may comprise a metal gate structure 112'. The PMOS device 119 may be disposed adjacent a fuse gate structure 121. The fuse gate structure 121 may comprise source/drain structures 113, 115 and a gate structure 112, which may be a metal gate structure 112. The fuse gate 121 may be programmed, wherein the gate structure 112 of the fuse gate 121 may experience a gate 112 oxide junction breakdown, and act as a diode 114 within the fuse gate structure 121.

In an un-programmed portion of the anti fuse circuit structure 117, a programming PMOS device 119' comprises source/drain structures 113''', 115''' and a gate structure 112''', wherein the gate structure 112''' may comprise a metal gate structure 112'''. The PMOS device 119' may be disposed adjacent a fuse gate structure 121', comprising source/drain structures 113'', 115'' and a metal gate structure 112''. The fuse gate 121' may be un-programmed in this case, wherein the fuse gate 121' may experience a build-up of charge 116 on/within the fuse gate 121'. In the prior art anti-fuse circuit structures 110, 117 (programmed/un-programmed fuse gates), there may be a voltage contrast difference detected/exhibited between the programmed and non-programmed fuse structures 119, 119', because of the charge built up 116 on the un-programmed fuse structure 119'.

Figure 1:
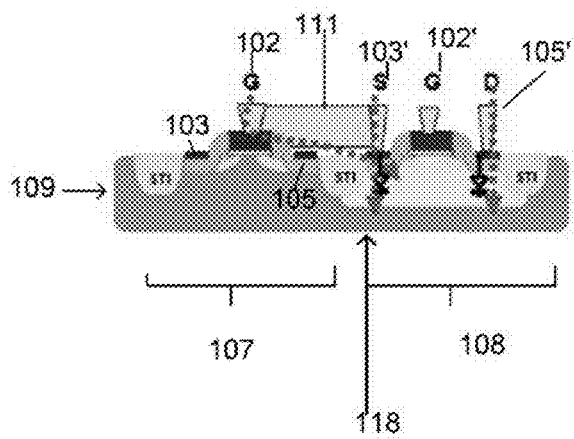
FIG. 1 represents a structure according to an embodiment.

FIG. 1 depicts an embodiment of the invention depicting a portion of an anti-fuse circuit structure 109, wherein a programming PMOS device 108 comprises source/drain structures 103', 105' and a gate structure 102', wherein the gate structure 102' may comprise a metal gate structure 102'. The PMOS device 108 may be disposed adjacent a fuse gate structure 107, that may comprise a metal fuse gate structure 107. The metal fuse gate structure 107 may comprise source/drain structures 103, 105 and a gate structure 102, such as a metal gate structure 102. The metal fuse gate 107 may comprise a conductive trace 111 that may be disposed between the gate structure 102 of the metal fuse gate structure 107 and the source/drain structure 103' of the PMOS device 108. In an embodiment, the conductive trace 111 may comprise a metal trace coupling the fuse gate structure 107 and the PMOS device 108.

The metal trace 111 between the metal fuse gate structure 107 and PMOS device 108 may comprise a portion of a parallel diode 118 within the fuse gate structure 107 that may serve to make the charge dissipation rate the same for the cases when the fuse gate 107 is either programmed or un-programmed. In an embodiment, the diode 118 provides a parallel electrical path to dissipate the charge on an un-programmed fuse gate structures 107. In an embodiment, the diode 118 may be added in such a way that there is no net electrical impact to the programming and functioning of the anti-fuse circuit 109, because the diode 118 added may be part of/coupled with the programming PMOS device 108 source/drain contact (in the case depicted in FIG. 1, the source/drain contact 103') that shares the same electrical node as the fuse gate 107. In an embodiment, an electrical connection between the metal fuse gate 107 and the parallel diode 118 may be at the same metallization level of the metal fuse gate 107 within the anti-fuse circuit 109. In an embodiment, the diode 118 may be disposed between a contact of the metal fuse gate (such as a gate 102 contact) and a contact of the PMOS device (such as a source/drain contact 103'), wherein the diode 118 couples the contact of the metal fuse gate 107 to the contact of the PMOS device 108.

In an embodiment, the connection/metal trace 111 between the fuse gate 107 and the diode 118 may be at the same level (i.e., at the same level of metallization), therefore making the removal of the connection/metal line 111 to establish a voltage contrast between programmed and un-programmed fuse structures (for example, during a product tear down for reverse engineering purposes) very difficult, if not impossible. Thus, use of a diode in parallel with the metal gate anti-fuse may be realized by forming a metal fuse gate level local connection, and may serve to prevent gate isolation by de-processing/reverse engineering techniques, such as but not limited to voltage contrast reverse engineering techniques.

Figure 2:
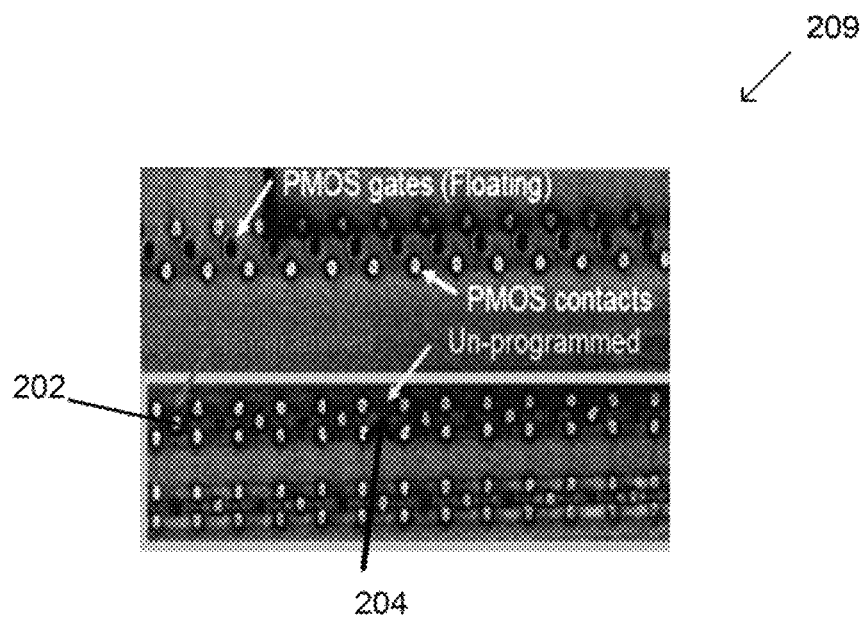
FIG. 2 represents a structure according to the Prior Art.
Figure 3:
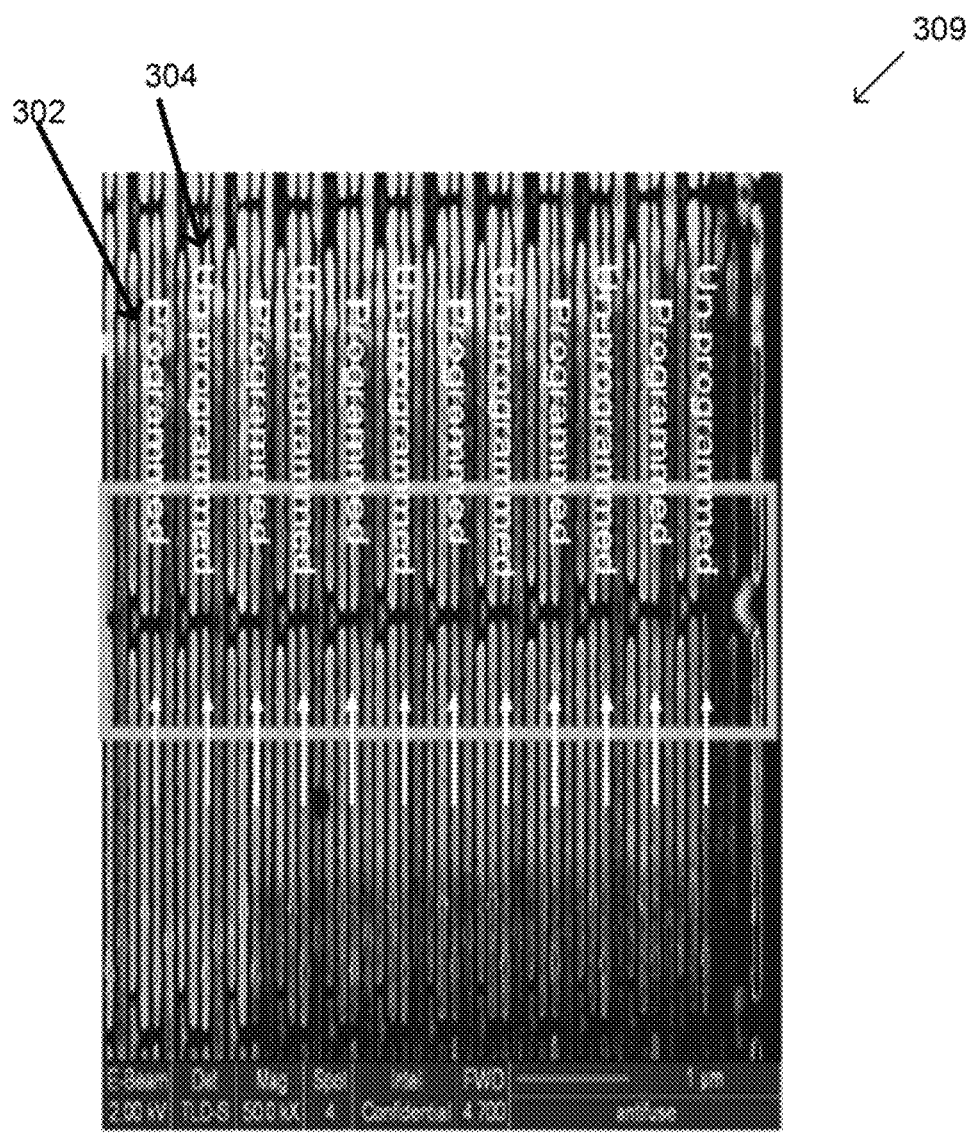
FIG. 3 represents a structure according to an embodiment.

FIG. 2 depicts a portion of an anti-fuse circuit according to the Prior Art. The anti-fuse circuit 209 design shows strong voltage contrast between programmed 202 and un-programmed 204 fuse bits. The difference between the programmed 202 and the un-programmed 204 fuse bits is due to the difference in charge dissipation rate between the prior art programmed/un-programmed fuse bit 202, 204. In contrast, FIG. 3 depicts a portion of an anti-fuse circuit 309 according to the embodiments herein, wherein there is no voltage contrast seen between the programmed 302 and the un-programmed 304 fuse bits.

Figure 4:
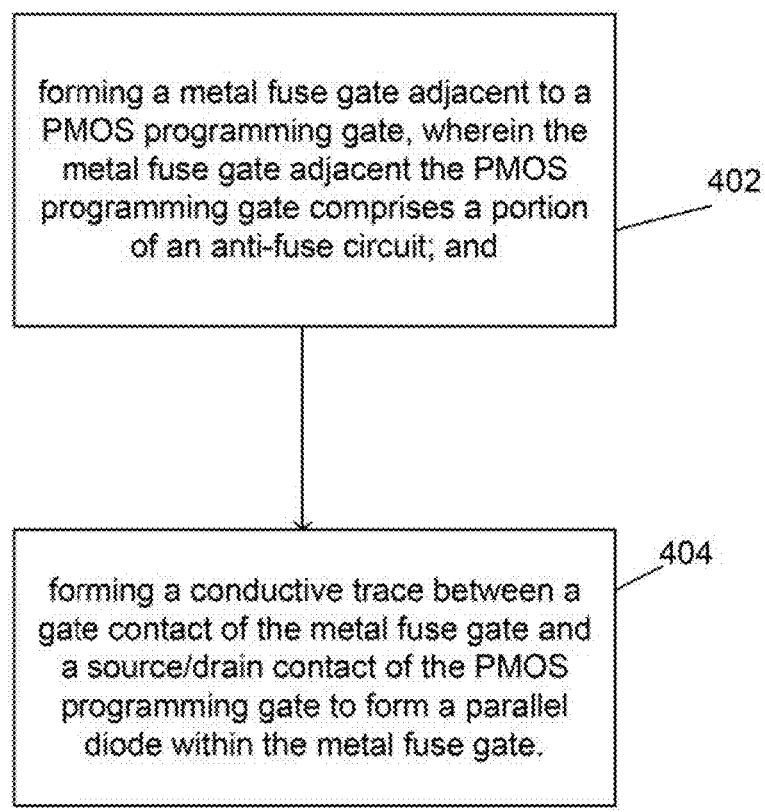
FIG. 4 represents a flow chart according to an embodiment.

FIG. 4 depicts a method according to an embodiment. At step 402, a metal fuse gate may be formed adjacent to a PMOS programming gate, wherein the metal fuse gate adjacent the PMOS programming gate comprises a portion of an anti-fuse circuit. At step 404, a conductive trace may be formed between a gate contact of the metal fuse gate and a source/drain contact of the PMOS programming gate, to form a parallel diode within the metal fuse gate.

Figure 5:
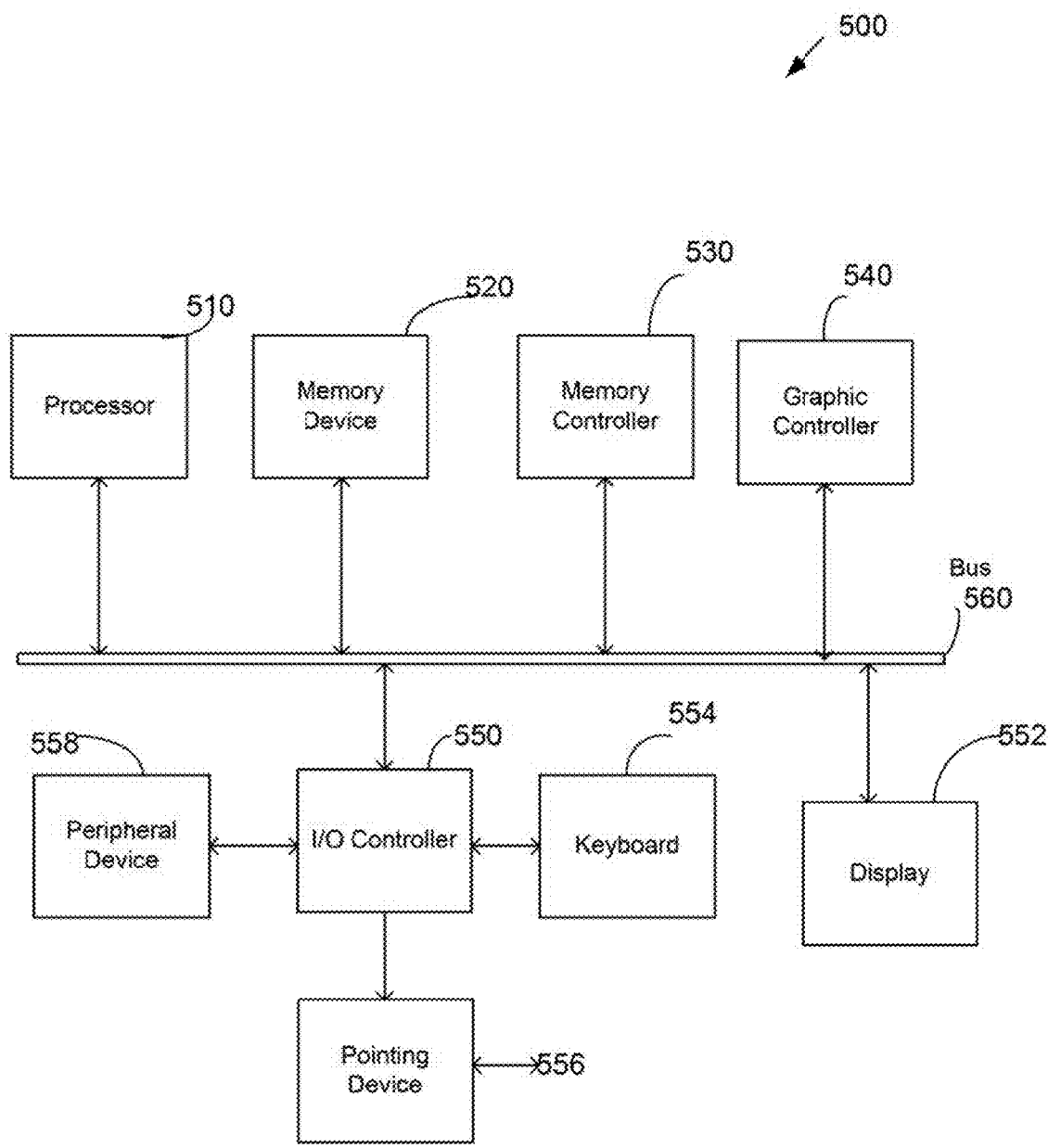
FIG. 5 represents a system according to an embodiment.

FIG. 5 shows a computer system according to an embodiment of the invention. System 500 includes a processor 510, a memory device 520, a memory controller 530, a graphics controller 540, an input and output (I/O) controller 550, a display 552, a keyboard 554, a pointing device 556, and a peripheral device 558, all of which may be communicatively coupled to each other through a bus 560, in some embodiments. Processor 510 may be a general purpose processor or an application specific integrated circuit (ASIC). I/O controller 550 may include a communication module for wired or wireless communication. Memory device 520 may be a dynamic random access memory (DRAM) device, a static random access memory (SRAM) device, a flash memory device, or a combination of these memory devices. Thus, in some embodiments, memory device 520 in system 500 does not have to include a DRAM device.

One or more of the components shown in system 500 may include one or more metal gate anti-fuse circuits, such as the metal gate anti-fuse structures of the various embodiments herein, such as those depicted in FIG. 1, by illustration and not limitation. For example, processor 510, or memory device 520, or at least a portion of I/O controller 550, or a combination of these components may be included in an integrated circuit package that includes at least one embodiment of the various metal gate anti-fuse circuits presented herein.

These elements perform their conventional functions well known in the art. In particular, memory device 520 may be used in some cases to provide long-term storage for the executable instructions for a method for forming metal gate anti-fuse circuits in accordance with embodiments of the present invention, and in other embodiments may be used to store on a shorter term basis the executable instructions of methods for forming metal gate anti-fuse circuits in accordance with embodiments of the present invention during execution by processor 510. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 520 may supply the processor 510 with the executable instructions for execution.

System 500 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments herein include providing for security of electronic data/information within fuse arrays of an anti-fuse circuit which may be sensitive (may be in need of security protection etc.). The embodiments may provide enhanced security for secured memory devices using/comprising fuse technologies, for example, and any other devices that may employ secured fuse arrays. Prior art anti-fuse circuits have been based on gate oxide breakdown using polysilicon gates, such as programmable read only memory (PROM). The polysilicon anti-fuse has been used for both secure fuses and non-fuses. However, prior art anti-fuse circuit content can easily be detected using voltage contrast technique. The various embodiments presented herein utilize a diode at the same layer as the metal fuse gate to prevent charge buildup on the un-programmed devices, thus eliminating the voltage contrast between the programmed and un-programmed bits, making the metal gate anti-fuse circuit of the embodiments presented herein secure.

Embodiments enable the elimination of voltage contrast de-processing (reverse engineering) of un-programmed bits that can be used by hackers to decode a fuse array circuit. Embodiments provide packaging, assembly, test and/or design solutions/applications for CPU's/processors, chipsets, graphics devices, wireless devices, multi-chip/3D packages including CPU in combination with other devices such as memory (e.g., flash/DRAM/SRAM/etc.) and boards (e.g., motherboards, etc.).

Although the foregoing description has specified certain steps and materials that may be used in the method of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, it is appreciated that various microelectronic structures, such as integrated circuits, are well known in the art. Therefore, the Figures provided herein illustrate only portions of an exemplary microelectronic structure that pertains to the practice of the embodiments. Thus the embodiments are not limited to the structures described herein.

What is claimed is:

1. A method comprising:

forming a metal fuse gate adjacent a PMOS programming gate, wherein the metal fuse gate adjacent the PMOS programming gate comprises a portion of an anti-fuse circuit; and forming a conductive trace between a gate contact of the metal fuse gate and a source/drain contact of the PMOS programming gate, wherein the conductive trace comprises a portion of a parallel diode within the metal fuse gate, and is configured to prevent a charge build-up within an unprogrammed metal fuse gate structure.

2. The method of claim 1 further comprising wherein the conductive trace between the metal fuse gate and the parallel diode is at the same level of metallization as the metal fuse gate.

3. The method of claim 1 wherein the parallel diode eliminates a voltage contrast between un-programmed and programmed metal fuse gates within the anti-fuse circuit.

4. A structure comprising:

a metal fuse gate adjacent a PMOS programming gate, wherein the metal fuse gate adjacent the PMOS programming gate comprises a portion of an anti-fuse circuit; and a conductive trace between a gate contact of the metal fuse gate and a source/drain contact of the PMOS programming gate, wherein the conductive trace comprises a portion of a parallel diode within the metal fuse gate and is configured to prevent a charge build-up within an unprogrammed metal fuse gate structure.

5. The structure of claim 4 wherein the anti-fuse circuit comprises sensitive data within a fuse array of the anti-fuse circuit.

6. The structure of claim 4 wherein the anti-fuse circuit comprises a portion of a secured memory device using fuse technology.

7. The structure of claim 4 further comprising a system comprising:

a bus is communicatively coupled to the structure; and a DRAM communicatively coupled to the bus.

8. The structure of claim 4 wherein the conductive trace comprises a metallic trace.

9. The structure of claim 4 wherein the diode is disposed at the same metallization layer as the metal fuse gate.

* * * * *